（12) United States Patent
Qualy et al.

(10) Patent No.: US 7,585,211 B2
(45) Date of Patent: Sep. 8, 2009

(54) TUBULAR MEMBRANE VENT (75) Inventors: Stephen J. Qualy, Shakopee, MN (US);
Carl Stegeman, Hutchinson, MN (US);
Merritt Pulkrabek, Hamburg, MN (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 409 days.

(21) Appl. No.: 11/205,658

(22) Filed: Aug. 17, 2005
(Under 37 CFR 1.47)

(65) Prior Publication Data
US 2007/0042704 A1 Feb. 22, 2007

(51) Int. Cl.
*F24F 7/00* (2006.01)
*B01D 19/00* (2006.01)

(52) U.S. Cl. .............. 454/270; 454/370; 96/6; 55/385.4

(58) Field of Classification Search .......... 454/4, 454/270, 274, 370; 215/261, 902; 96/6; 55/385.4; 220/372, 371
See application file for complete search history.

(56) References Cited

U.S. PATENT DOCUMENTS

| 2,016,294 | A | * | 10/1935 | Replogle | 55/368 |
| 2,731,105 | A | * | 1/1956 | Nijland | 55/385.1 |
| 3,033,911 | A | * | 5/1962 | Duddy | 429/86 |
| 3,394,815 | A | * | 7/1968 | Harms | 210/323.2 |
| 3,750,889 | A | * | 8/1973 | Acosta | 210/497.01 |
| 3,866,789 | A | * | 2/1975 | Lambert | 220/303 |
| 3,868,325 | A | * | 2/1975 | Otto | 210/232 |
| 4,032,311 | A | * | 6/1977 | Bohmrich et al. | 55/385.4 |
| 4,276,069 | A | * | 6/1981 | Miller | 55/379 |
| 4,392,872 | A | * | 7/1983 | Hall et al. | |
| 4,442,004 | A | * | 4/1984 | Smith et al. | 210/448 |
| 4,581,137 | A | | 4/1986 | Edwards et al. | |
| 4,594,082 | A | * | 6/1986 | Catherwood, Sr. | 96/138 |
| 4,809,144 | A | * | 2/1989 | Suzuki | 362/547 |
| 4,974,745 | A | | 12/1990 | Jocham | |
| 5,034,165 | A | * | 7/1991 | Willinger et al. | 261/122.1 |
| 5,205,848 | A | * | 4/1993 | Blanc et al. | 55/310 |
| 5,341,951 | A | * | 8/1994 | Springston | 220/371 |
| 5,353,949 | A | | 10/1994 | Seibert et al. | |

(Continued)

FOREIGN PATENT DOCUMENTS

DE 3007075 A * 9/1981

(Continued)

OTHER PUBLICATIONS

GORE™ Membrane Vents, Screw-in Vent: POV/M12x1,5, 2 pgs. (2002).

(Continued)

*Primary Examiner*—Steven B McAllister
*Assistant Examiner*—Patrick F. O'Reilly, III
(74) *Attorney, Agent, or Firm*—Fogg & Powers LLC (57) ABSTRACT A sealed enclosure is provided. The enclosure includes a membrane vent adapted to mount through a wall of the enclosure, the membrane vent comprising an air permeable tubular membrane, a tubular structural support, wherein the tubular membrane is stretched over the tubular structural support, an air vent fitting attached to the tubular membrane at a first end, and an end cap attached to the tubular membrane at a second end.

30 Claims, 7 Drawing Sheets

U.S. PATENT DOCUMENTS

| | | | |
|---|---|---|---|
| 5,407,570 A | | 4/1995 | Hobson, Jr. |
| 5,417,743 A | | 5/1995 | Dauber |
| 5,464,469 A | * | 11/1995 | Close et al. .................... 96/220 |
| 5,522,769 A | | 6/1996 | DeGuiseppi |
| 5,580,456 A | | 12/1996 | Bowlsbey |
| 5,736,045 A | * | 4/1998 | Bies et al. .............. 210/497.01 |
| 5,814,118 A | * | 9/1998 | Wickland et al. .......... 55/385.4 |
| 5,901,867 A | | 5/1999 | Mattson |
| 5,914,415 A | | 6/1999 | Tago |
| 5,954,846 A | * | 9/1999 | Chowdhury et al. ....... 55/385.1 |
| 6,579,342 B2 | | 6/2003 | Wang et al. |

FOREIGN PATENT DOCUMENTS

| | | |
|---|---|---|
| EP | 1527956 | 5/2005 |

OTHER PUBLICATIONS

GORE™ Membrane Vents, Snap-in Vent: POV/Snap-Fit, 2 pgs. (2002).

GORE™ Membrane Vents, Press-Fit Vent: HYSI, 2 pgs. (2002).

Sealing Devices, Inc., Gore's Prevent™ enclosure vents, http://www.sealingdevices.com/products/gore.html, 1 pg. (Oct. 1, 2004).

GORE™ Membrane Vents, Series QPE: Quick Pressure Equalization, 2 pgs. (2002).

ITW Filtration, Vent Filter Applications, http://www.itwfiltration.com/vent.html, 1 pg. (Oct. 1, 2004).

Pall Corporation, Acro® 50 Vent Filter with Emflon® II Membrane, http://www.labfilters.com/catalog/924_19977.asp, 1 pg. (Oct. 1, 2004).

Donaldson Company, Tetratex® PTFE Membranes, http://www.donaldson.com/en/filtermedia/membranes, 2 pgs. (2002).

Whatman, PLC, Laboratory Filtration Microfiltration, In-Line Filters, 4 pgs. (Oct. 1, 2004).

Plant-tc Monthly Archive, Winthrop, RE: PTFE Membrane Vent Seals, http://plant-tc.coafes.umn.edu/listserv/1999/log9909/msg00038.html, 2 pgs. (Sep. 5, 1999).

* cited by examiner

TUBULAR MEMBRANE VENT

TECHNICAL FIELD

The present invention relates to ventilation of enclosures.

BACKGROUND

Membrane vents are used, for example, in the automotive and telecommunications industries to equalize pressure between the interior and exterior of otherwise sealed enclosures. In membrane vents, membranes generally comprise porous air-transmitting material that is preferably impermeable to liquids. Membrane vents are therefore able to equalize pressure, while minimizing contamination of enclosure interiors.

The effectiveness of a membrane vent at pressure equalization is dependant upon both the material composition of the membrane, and upon the membrane's surface area. In the prior art, a membrane is approximately flat and arranged perpendicular to a small bore in the enclosure wall so as to completely cover the bore. This provides for a membrane surface area equal to or only slightly larger than the cross section of the bore, limiting the rate of pressure equalization. During periods of moderate to high changes in interior or exterior pressure, such limited rates of pressure equalization proves detrimental.

SUMMARY

A membrane vent is provided. The vent includes an air permeable tubular membrane, a tubular structural support adapted to be received by the tubular membrane, an air vent fitting attached to the tubular membrane at a first end and an end cap attached to the tubular membrane at a second end.

A sealed enclosure is provided. The enclosure includes a membrane vent adapted to mount through a wall of the enclosure, the membrane vent comprising an air permeable tubular membrane, a tubular structural support, wherein the tubular membrane is stretched over the tubular structural support, an air vent fitting attached to the tubular membrane at a first end and an end cap attached to the tubular membrane at a second end.

DETAILED DESCRIPTION

In the following detailed description, reference is made to the accompanying drawings that form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1A:
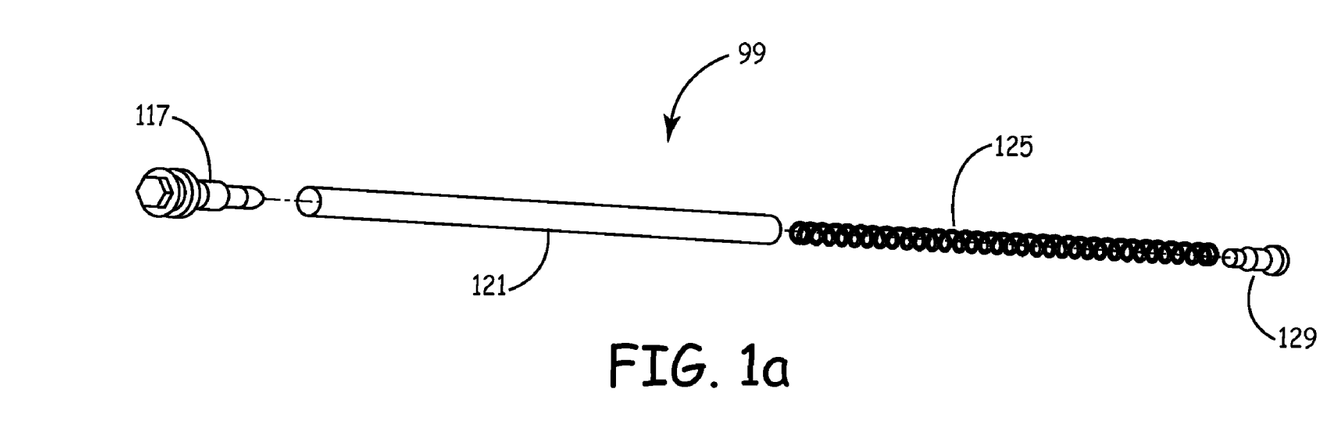
FIG. 1a depicts a perspective view of a tubular membrane vent prior to assembly in accordance with one embodiment of the present invention.
Figure 1B:
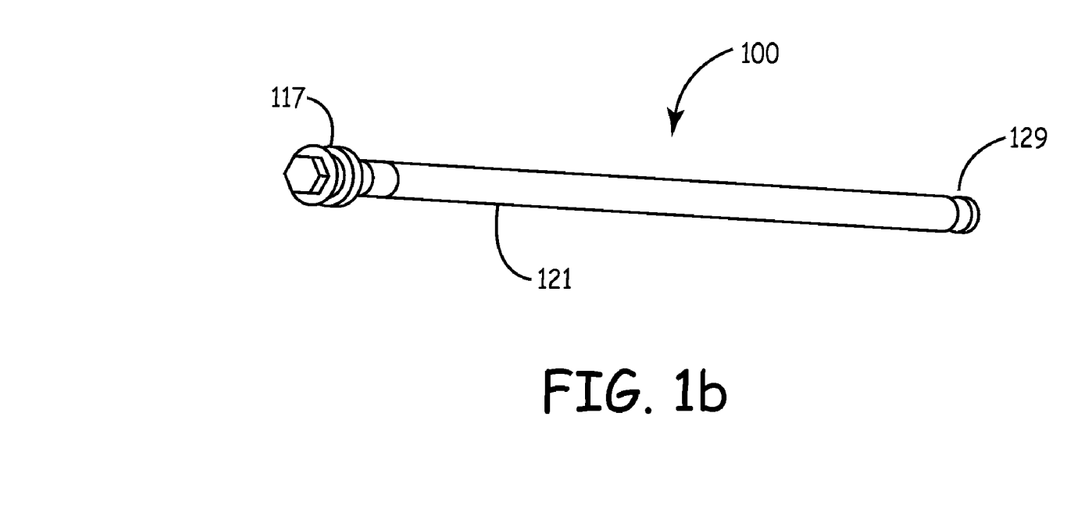
FIG. 1b illustrates a perspective view of the tubular membrane vent of FIG. 1A after assembly in accordance with one embodiment of the present invention.

FIG. 1A illustrates a perspective view of a tubular membrane vent prior to assembly, shown generally at 99, in accordance with one embodiment of the present invention. The tubular membrane vent comprises an air vent fitting 117, a tubular membrane 121, a tubular structural support 125, and a vent cap 129. FIG. 1B shows the tubular membrane vent 99 of FIG. 1A after assembly, shown generally at 100. As illustrated, the tubular structural support 125 is inserted inside the tubular membrane 121 to provide strength and maintain the shape of the tubular membrane 121. The air vent fitting 117 is affixed to one end of the tubular membrane 121, and the vent cap 129 is affixed to the opposite end. In one embodiment, the connections between the air vent fitting 117 and the tubular membrane 121 and the vent cap 129 and the tubular membrane 121 are air tight connections. This permits air and pressure transfer only through the tubular membrane 121, preventing leakage at the interconnects.

In the illustrated embodiment, the tubular membrane 121 comprises a cylinder having a diameter approximate to the diameter of the bore, and a length. In one embodiment, the tubular membrane 121 has a length of between 3 and 10 inches and a diameter between ⅛ and 1 inch. In alternative embodiments, the tubular membrane 121 comprises cylinders larger in diameter than the enclosure opening and diameters smaller than the enclosure opening. In still further embodiments, the tubular membrane 121 comprises alternative shapes, such as a tubular membrane 121 having a flared end or a bulbous tubular membrane 121.

In one embodiment, tubular membrane 121 comprises an air permeable hydrophobic material. In an alternative embodiment, tubular membrane 121 comprises air permeable material that is both hydrophobic and oleophobic. In certain embodiments, tubular membrane 121 comprises a polytetrafluoroethylene (PTFE) membrane. In one embodiment, tubular membrane 121 comprises TETRATEX Performance Fabrics by Donaldson Corporation.

In the illustrated embodiment of FIG. 1A, tubular structural support 125 comprises a metal coil spring. In one embodiment, the metal coil spring is coated with a non-conductive material. In alternative embodiments, nonmetal coil springs are used, such as springs comprising various plastics, elastomer, nylon, or the like. In still other alternative embodiments, non-spring structural supports 125 are implemented.

Figures 2A, 2B, 2C, 2D:
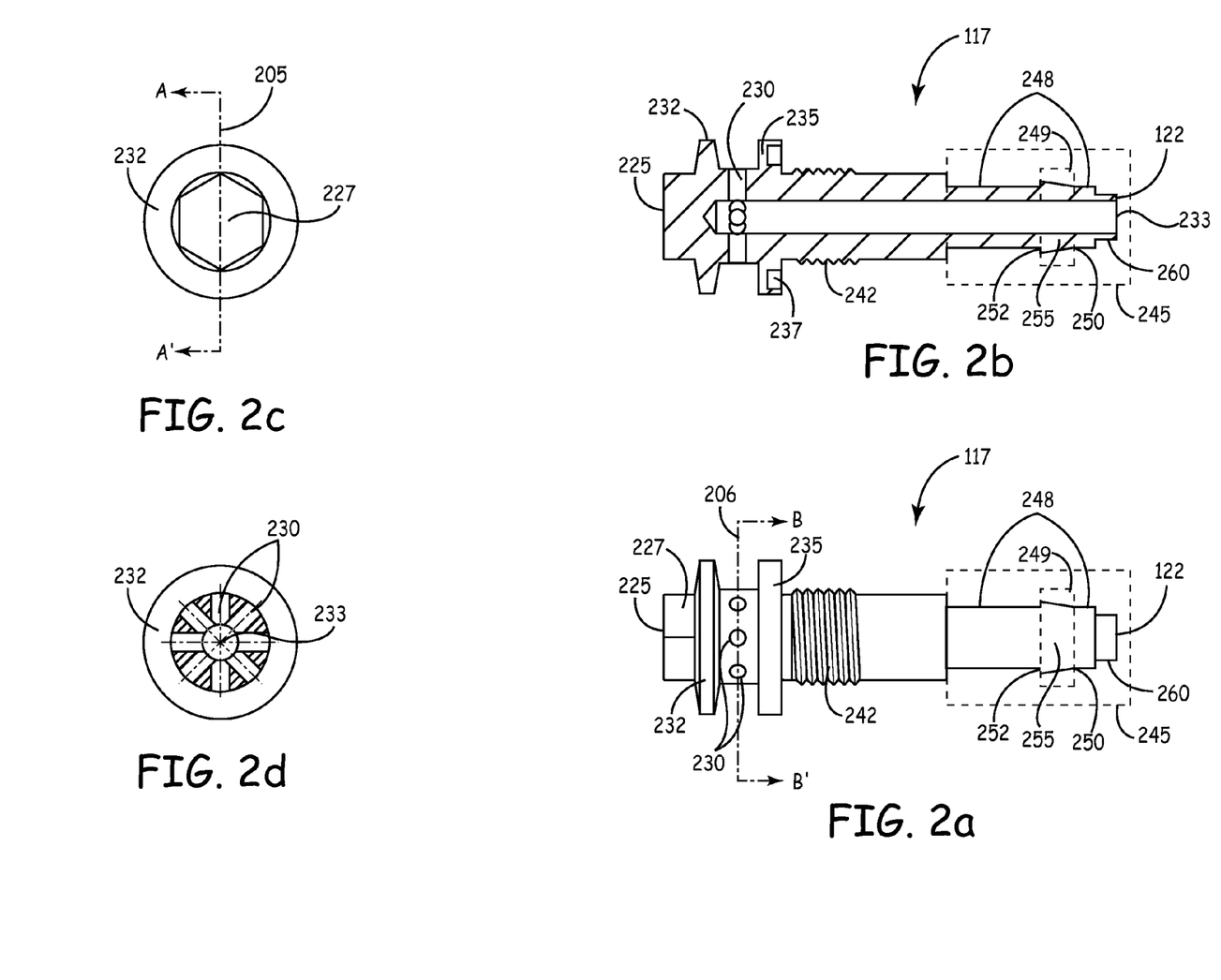
FIG. 2a shows a side view of a threaded air vent fitting of the tubular membrane vent in accordance with one embodiment of the present invention.
FIG. 2b shows a cross sectional side view of the threaded air vent fitting of FIG. 2A in accordance with one embodiment of the present invention.
FIG. 2c illustrates a cut away of the threaded air vent fitting of FIG. 2A along the radial axis in accordance with one embodiment of the present invention.
FIG. 2d illustrates a cross sectional view of FIG. 2C in accordance with one embodiment of the present invention.

FIG. 2A depicts a side view representation (along the longitudinal axis) of a threaded air vent fitting, shown generally at 117, of the tubular membrane vent 100 in accordance with one embodiment of the present invention. In the illustrated embodiment, the air vent fitting 117 has an upper tip 122 and a lower tip 225 disposed at opposite ends along the longitudinal axis. FIG. 2B shows a cross sectional side view representation of FIG. 2A, cut along line A-A' 205 (illustrated in FIG. 2C). FIG. 2C shows the threaded air vent fitting of FIG. 2A along the radial axis, looking up from the lower tip 225. FIG. 2D shows a cross sectional view of FIG. 2C, cut along line B-B' 206 (illustrated in FIG. 2A). The threaded air vent fitting 117 has a body comprising, for example, an acetal resin engineering plastic such as DELRIN, a polytetrafluoroethylene ("PTFE") such as TEFLON, polypropylene, stainless steel, nylon, or other corrosion resistant material. The lower tip 225 comprises a hexagonal end 227 situated such that torque can be applied, such as by a wrench, along the radial axis. In alternative embodiments, other torque enabling configurations may be used, such as shapes designed to accept the application of rotational force by means of, for example, screw drivers, allen wrenches, and the like.

A plurality of vents 230 are separated from the lower tip 225 by a radial flared region 232 and disposed perpendicular to the longitudinal axis. In certain embodiments, the radial flared region 232 promotes the ease of applying torque and protects the plurality of vents 230. In alternative embodiments the flared region 232 is absent. The threaded air vent fitting 117 has a hollow core 233 that extends from the upper tip 122 to the plurality of air vents 230. In alternative embodiments, the hollow core 233 extends slightly beyond the plurality of vents 230. In further embodiments, the hollow core 233 extends from the upper tip 122 to the lower tip 225.

A flange 235 is situated adjacent the plurality of vents 230 along the longitudinal axis. A circumferential groove 237 is located along the side of the flange 235 nearest the upper tip 122. Disposed within the circumferential groove 237 is a gasket (not shown). In one embodiment, the gasket is comprised of silicone, rubber, polyurethane, or the like. Adjacent the flange 235 along the longitudinal axis is disposed a threaded region 242. The threaded region 242 is designed to couple, for example, with a threaded bore of an electrical enclosure.

A connector member 245 extends along the longitudinal axis from the upper tip 122 towards the threaded region 242. In the illustrated embodiment, the connector member 245 comprises a first cylindrical section 248 approximately matching the diameter of the tubular membrane 121. A ring shaped projection 249 is formed along the circumferential face of the first cylindrical section 248. The ring shaped projection 249 has a first diameter 250 disposed near the upper tip 122 and a second diameter 252 disposed further from the upper tip 122, the first diameter 250 corresponding to the diameter of the cylindrical section 248, and the second diameter 252 being greater than the cylindrical section 248 in diameter. Between the first diameter 250 and second diameter 252 is formed a truncated cone 255, as illustrated in FIG. 2A. In one embodiment, the connector member 245 further comprises a second cylindrical section 260 extending from the upper tip 122 to the first cylindrical section 248. The second cylindrical section 260 has a diameter approximately equal to the inner diameter of the tubular structural support 125.

When the connector member 245 is inserted into tubular membrane 121, the ring shaped projection 249 expands tubular membranes 121's diameter. In one embodiment, this expansion causes a tight seal due to the tubular membrane's 121 elasticity and resistance to expansion. Concurrently, the second cylindrical section 260 couples to tubular structural support 125, providing additional mechanical strength. In certain embodiments a clamping member (not shown) is implemented along the first cylindrical section 248 after insertion into tubular membrane 121 to apply additional securing force. In one embodiment, clamping member is comprised of heat shrink tubing, a wire tie, a cable tie, or the like.

Figure 3A:
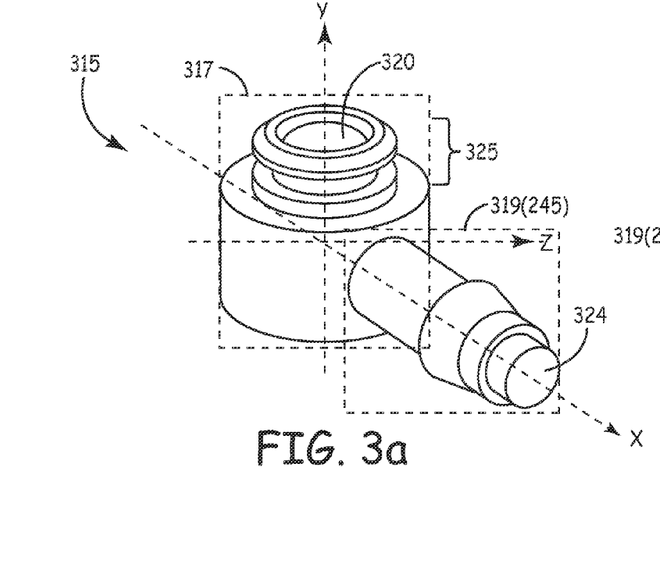
FIG. 3a illustrates a perspective view of a plug air vent fitting in accordance with one embodiment of the present invention.
Figure 3B:
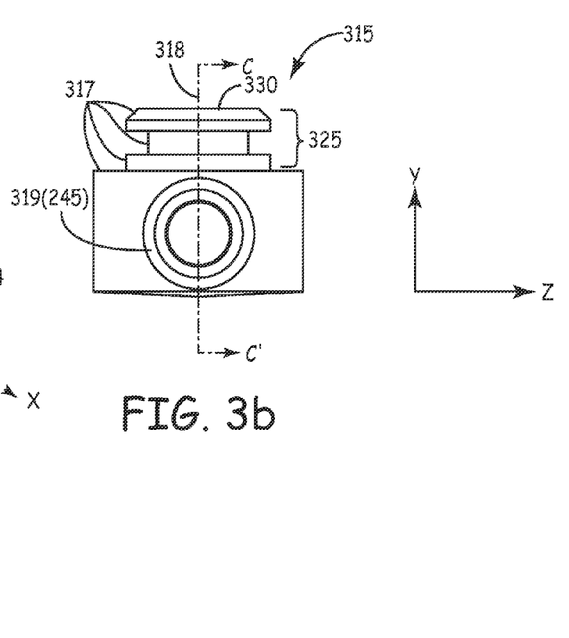
FIG. 3b illustrates a representation of a plug air vent fitting in accordance with one embodiment of the present invention.
Figure 3C:
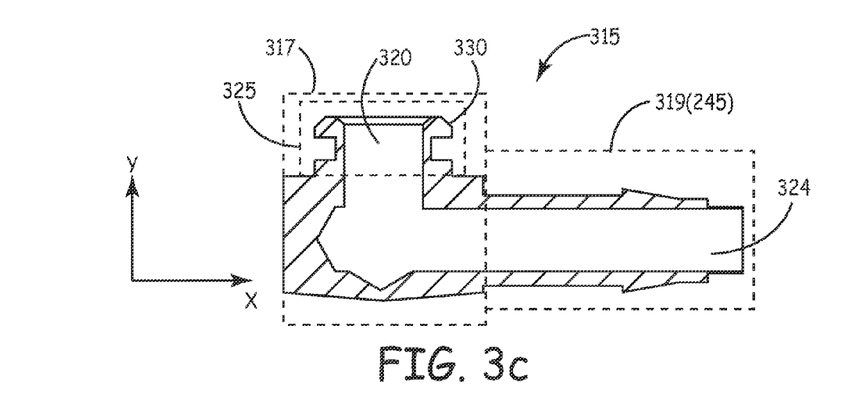
FIG. 3c illustrates a side view representation of a plug air vent fitting in accordance with one embodiment of the present invention.

In alternative embodiments, securing means other than a threaded fitting are used to attach tubular membrane vent 100 to an enclosure. FIGS. 3a, 3b, and 3c illustrate one possible alternative securing means. FIG. 3a shows a perspective view of a plug air vent fitting, shown generally at 315, in accordance with one embodiment of the present invention. FIG. 3b illustrates a representation of the same plug air vent fitting 315 in the Y-Z plane. FIG. 3c shows a side view representation of plug air vent fitting 315 cut along line C-C' 318 in the X-Y plane. Plug air vent fitting 315 comprises a first radial portion 317 and a second radial portion 319, the second radial portion 319 intersecting the first radial portion 317 at a ninety degree angle. In one embodiment first radial portion 317 has a diameter greater than the diameter of second radial portion 319, and a length less than the length of second radial portion 319. First radial portion 317 has a first opening 320 and second radial portion 319 has a second opening 324, second opening 324 intersecting first opening 320 at a right degree angle to form a through air passageway. First radial portion 317 comprises a plug 325. In one embodiment, plug 325 has a diameter equal to a corresponding bore in an electrical enclosure. In certain embodiments, plug 325 further comprises a flared end 330. In the illustrated embodiment, second radial portion 319 comprises a connector member 245 as described with respect to FIGS. 2A and 2B above.

Figure 4A:
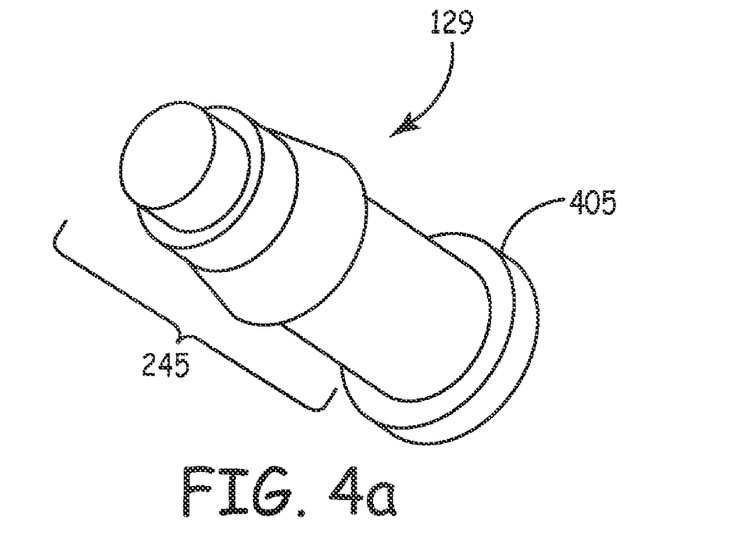
FIG. 4a illustrates a perspective view of a vent cap of the tubular membrane vent in accordance with one embodiment of the present invention.
Figure 4B:
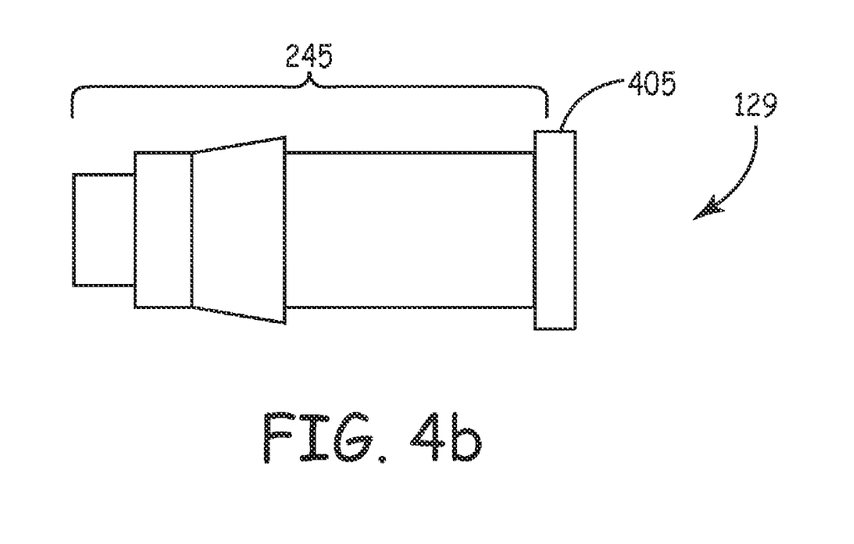
FIG. 4b illustrates a side view of a vent cap of the tubular membrane vent in accordance with one embodiment of the present invention.
Figure 5A:
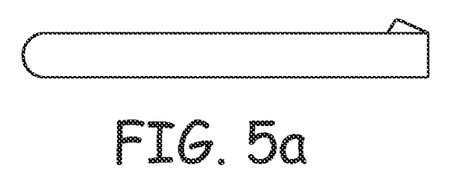
FIG. 5a illustrates a tubular membrane in accordance with one embodiment of the present invention.
Figure 5B:
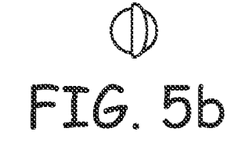
FIG. 5b illustrates a tubular membrane in accordance with one embodiment of the present invention.
Figure 5C:
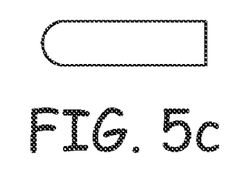
FIG. 5c illustrates a tubular membrane in accordance with one embodiment of the present invention.
Figure 5D:
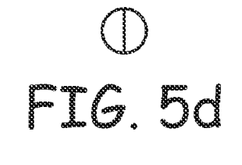
FIG. 5d illustrates a tubular membrane in accordance with one embodiment of the present invention.

FIGS. 4a and 4b illustrate a perspective view and a side view, respectively, of a vent cap 129, in accordance with one embodiment of the present invention. In one embodiment, vent cap 129 comprises substantially the same material or materials as air vent fitting 117. In the illustrated embodiment, vent cap 129 comprises a connector member 245 described with respect to FIGS. 2A and 2B above. Vent cap 129 further comprises a flared end 405. In alternative embodiments, no vent cap 129 is implemented. Where no vent cap 129 is implemented, in one embodiment tubular membrane 121 is sealed at one end by folding tubular membrane 121 as illustrated in FIGS. 5a and 5b. In alternative embodiments, tubular membrane 121 is sealed at one end by pinching it off, as illustrated in FIGS. 5c and 5d. In one embodiment, an adhesive is used to maintain the seal of the pinched off or folded over end.

Figure 6A:
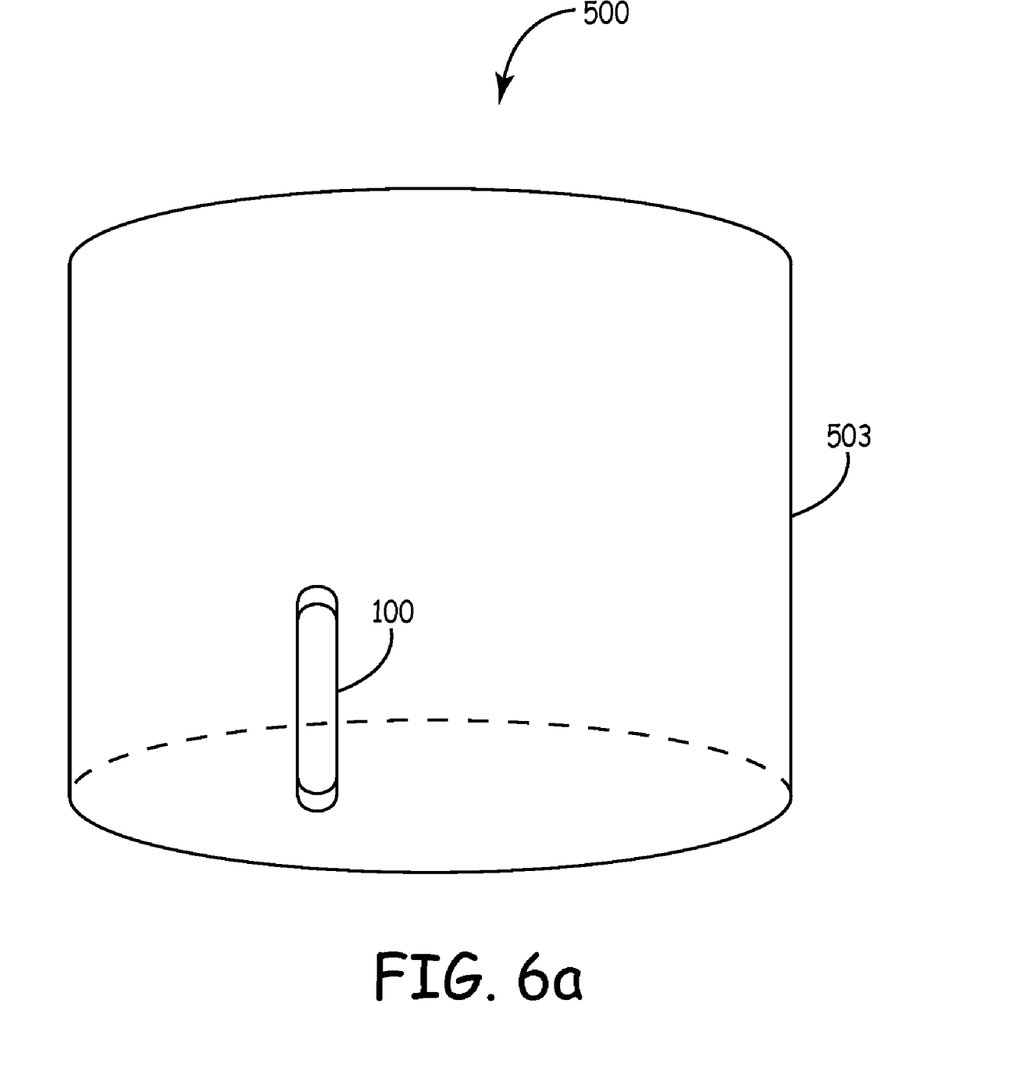
FIG. 6a illustrates a perspective view of a tubular membrane vent in accordance with one embodiment of the present invention.
Figure 6B:
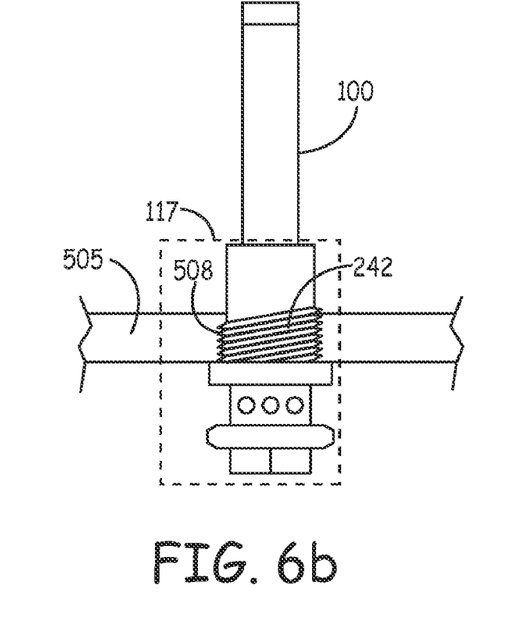
FIG. 6b illustrates a side view representation of a tubular membrane vent in accordance with one embodiment of the present invention.
Figure 6C:
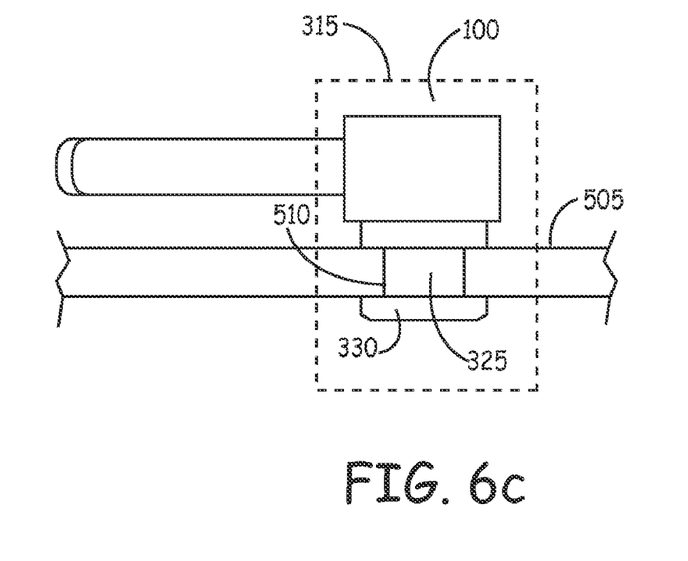
FIG. 6c illustrates a side view representation of a tubular membrane vent in accordance with one embodiment of the present invention.

FIG. 6a illustrates a perspective view of a tubular membrane vent 100 coupled to an electrical enclosure 503, shown generally at 500, in accordance with one embodiment of the present invention. FIG. 6b shows a side view representation of a tubular membrane vent 100 having a threaded air vent fitting 117 coupled to an electrical enclosure wall 505. As illustrated, the threaded region 242 has a diameter equal to the diameter of a threaded bore 508 in the electrical enclosure wall 505. FIG. 6c shows a side view representation of a tubular membrane vent 100 having a plug air vent fitting 315 coupled to an electrical enclosure wall 505. In the illustrated embodiment, the plug air vent fitting 315 has a plug 325 with a flared end 330, the plug being the same diameter as a bore 510 in the electrical enclosure wall 505.

Tubular membrane vent 100 enables enclosures to maintain weather tight status and protection from wind, rain, icing, dust and the intrusion of water when submersed.

What is claimed is:

1. A membrane vent comprising:
   an air permeable tubular membrane;
   a tubular structural support adapted to be received by the tubular membrane;
   an air vent fitting attached to the tubular membrane in an air tight manner at a first end, the air vent fitting including:
      a connector member, comprising:
         a first cylindrical section having a portion with a diameter that approximately matches the tubular membrane and is less than the length of the first cylindrical section in the axial direction, the first cylindrical section having a shaped projection comprising a portion with a diameter greater than the diameter of the first cylindrical section, and
         a second cylindrical section, the second cylindrical section having a diameter substantially equal to an inner diameter of the tubular structural support,
         wherein the connector member is inserted into the tubular membrane in such manner that the shaped projection of the first cylindrical section expands the tubular membrane in the air tight manner; and
      an end cap attached to the tubular membrane in an air tight manner at a second end.

2. The membrane vent of claim 1, wherein the tubular structural support comprises a coil spring.

3. The membrane vent of claim 2, wherein the coil spring is made of a plastic or a metal.

4. The membrane vent of claim 2, wherein the tubular structural support is coated with a non-conducting material.

5. The membrane vent of claim 1, wherein the tubular membrane has a length that is larger than its diameter.

6. The membrane vent of claim 5, wherein the tubular membrane has a length of between 3 and 10 inches and a diameter between 1/8 and 1 inch.

7. The membrane vent of claim 1, wherein the tubular membrane comprises an air permeable hydrophobic material.

8. The membrane vent of claim 1, wherein the tubular membrane comprises an air permeable hydrophobic and oleophobic material.

9. The membrane vent of claim 1, wherein the tubular membrane comprises a polytetrafluoroethylene (PTFE) membrane.

10. The membrane vent of claim 1, wherein the air vent fitting comprises a threaded air vent fitting.

11. The membrane vent of claim 10, wherein one end of the threaded air vent fitting is adapted to accept application of rotational force.

12. The membrane vent of claim 1, wherein the air vent fitting comprises a plug air vent fitting.

13. The membrane vent of claim 1, wherein the tubular membrane is oriented perpendicular to the air vent fitting.

14. The membrane vent of claim 1, wherein the air vent fitting comprises a corrosion resistant material.

15. The membrane vent of claim 14, wherein the air vent fitting comprises at least one of acetal resin, PTFE, polypropylene, stainless steel, nylon, and rubber.

16. The membrane vent of claim 1, wherein the end cap is made of a corrosion resistant material.

17. The membrane vent of claim 16, wherein the end cap is made of at least one of acetal resin, PTFE, polypropylene, stainless steel, and nylon.

18. The membrane vent of claim 1, wherein the shaped projection is a truncated cone.

19. The membrane vent of claim 1, wherein the portion of the shaped projection with the greater diameter is disposed on a side nearest a threaded region of the air vent fitting.

20. The membrane vent of claim 1, wherein the air vent fitting further comprises a plurality of air vents, each of the air vents radially separated from one another and disposed perpendicular to a longitudinal axis of the air vent fitting.

21. A membrane vent comprising:
   a tubular membrane;
   a tubular structural support mounted within the tubular membrane;
   an air vent fitting attached to a first end of the tubular membrane, the air vent fitting including a connector member, the connector member comprising:
      a first cylindrical section having a portion with a diameter that approximately matches the tubular membrane and is less than the length of the first cylindrical section in the axial direction, the first cylindrical section having a shaped projection comprising a portion with a diameter greater than the diameter of the first cylindrical section, and
      a second cylindrical section, the second cylindrical section having a diameter substantially equal to an inner diameter of the tubular structural support,
      wherein the connector member is inserted into the tubular membrane in such manner that the shaped projection of the first cylindrical section expands the tubular membrane in the air tight manner; and
   wherein a second end of the tubular membrane is sealed.

22. The membrane vent of claim 21, wherein the second end of the tubular membrane is sealed by folding over the second end.

23. The membrane vent of claim 21, wherein the second end of the tubular membrane is sealed by pinching off the second end.

24. The membrane vent of claim 21, wherein the shaped projection is a truncated cone.

25. The membrane vent of claim 21, wherein the portion of the shaped projection with the greater diameter is disposed on a side nearest a threaded region of the air vent fitting.

26. The membrane vent of claim 21, wherein the air vent fitting further comprises a plurality of air vents, each of the air vents radially separated from one another and disposed perpendicular to a longitudinal axis of the air vent fitting.

27. A sealed enclosure comprising:
   a membrane vent adapted to mount through a wall of the enclosure, the membrane vent comprising:
      an air permeable tubular membrane;

a tubular structural support, wherein the tubular membrane is stretched over the tubular structural support;

an air vent fitting attached to the tubular membrane at a first end, the air vent fitting including a connector member, the connector member comprising:

a first cylindrical section having a portion with a diameter that approximately matches the tubular membrane and is less than the length of the first cylindrical section in the axial direction, the first cylindrical section having a shaped projection comprising a portion with a diameter greater than the diameter of the first cylindrical section, and a second cylindrical section, the second cylindrical section having a diameter substantially equal to an inner diameter of the tubular structural support, wherein the connector member is inserted into the tubular membrane in such manner that the shaped projection of the first cylindrical section expands the tubular membrane in the air tight manner; and an end cap attached to the tubular membrane at a second end.

28. The sealed enclosure of claim 27, wherein the shaped projection is a truncated cone.

29. The sealed enclosure of claim 27, wherein the portion of the shaped projection with the greater diameter is disposed on a side nearest a threaded region of the air vent fitting.

30. The sealed enclosure of claim 27, wherein the air vent fitting further comprises a plurality of air vents, each of the air vents radially separated from one another and disposed perpendicular to a longitudinal axis of the air vent fitting.

* * * * *

UNITED STATES PATENT AND TRADEMARK OFFICE
CERTIFICATE OF CORRECTION

PATENT NO. : 7,585,211 B2
APPLICATION NO. : 11/205658
DATED : September 8, 2009
INVENTOR(S) : Qualy et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 413 days.

Signed and Sealed this

Fourteenth Day of September, 2010

David J. Kappos
*Director of the United States Patent and Trademark Office*